United States Patent
Akahori et al.

(10) Patent No.: US 8,723,245 B2
(45) Date of Patent: May 13, 2014

(54) NONVOLATILE MEMORY DEVICE

(75) Inventors: Hiroshi Akahori, Yokohama (JP);
Kiyohito Nishihara, Yokohama (JP);
Masaki Kondo, Kawasaki (JP);
Yingkang Zhang, Yokohama (JP);
Shigeo Kondo, Saitama (JP); Hidenobu Nagashima, Yokohama (JP); Kazuaki Iwasawa, Yokohama (JP); Takashi Ichikawa, Saitama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 6 days.

(21) Appl. No.: 13/052,531

(22) Filed: Mar. 21, 2011

(65) Prior Publication Data
US 2012/0007163 A1 Jan. 12, 2012

(30) Foreign Application Priority Data
Jul. 7, 2010 (JP) .................. 2010-154850

(51) Int. Cl.
*H01L 29/788* (2006.01)
(52) U.S. Cl.
CPC .................. *H01L 29/7883* (2013.01)
USPC ........................................................ 257/316
(58) Field of Classification Search
USPC ............ 257/314–316, E29.3, E29.309;
438/257–259, 261, 264
See application file for complete search history.

(56) References Cited

U.S. PATENT DOCUMENTS

| | | | |
|---|---|---|---|
| 5,729,035 A * | 3/1998 | Anma .................. | 257/324 |
| 5,949,101 A * | 9/1999 | Aritome ................ | 257/315 |
| 6,570,211 B1 * | 5/2003 | He et al. ................ | 257/314 |
| 6,768,161 B2 * | 7/2004 | Kinoshita .............. | 257/316 |
| 6,969,884 B2 * | 11/2005 | Kitamura et al. ....... | 257/315 |
| 7,514,741 B2 * | 4/2009 | Lee et al. ............... | 257/316 |
| 7,554,149 B2 * | 6/2009 | Kim ...................... | 257/315 |
| 7,651,914 B2 * | 1/2010 | Akahori et al. ........ | 438/257 |
| 7,679,129 B1 * | 3/2010 | Hui et al. ............... | 257/316 |
| 7,723,772 B2 * | 5/2010 | Ozawa et al. .......... | 257/314 |
| 7,786,525 B2 * | 8/2010 | Shimizu ................ | 257/316 |
| 7,799,637 B2 * | 9/2010 | Mokhlesi .............. | 438/261 |
| 7,927,949 B2 * | 4/2011 | Ozawa et al. .......... | 438/257 |
| 7,968,399 B2 * | 6/2011 | Kitamura et al. ...... | 438/211 |
| 8,049,269 B2 * | 11/2011 | Lee et al. ............... | 257/324 |
| 8,063,429 B2 * | 11/2011 | Hendriks et al. ...... | 257/315 |
| 8,207,560 B2 * | 6/2012 | Kajimoto .............. | 257/288 |

(Continued)

FOREIGN PATENT DOCUMENTS

| | | | |
|---|---|---|---|
| JP | 2006173452 A | * | 6/2006 |
| JP | 2008-270351 | | 11/2008 |
| JP | 2010-114131 | | 5/2010 |

*Primary Examiner* — Michele Fan
(74) *Attorney, Agent, or Firm* — Finnegan, Henderson, Farabow, Garrett & Dunner, L.L.P.

(57) ABSTRACT

According to one embodiment, a nonvolatile memory device includes a substrate, first and second tunnel insulating films, first and second floating gate electrodes, an intergate insulating film and a control gate electrode. The substrate has first and second active regions isolated from each other by an element isolation trench. The first and second tunnel insulating films are located in the first and second active regions, respectively. The first and second floating gate electrodes are located on the first and second tunnel insulating films, respectively. The intergate insulating film includes a first insulating layer of a first insulating material, an electron trap layer of a second insulating material on the first insulating layer, and a second insulating layer of the first insulating material on the electron trap layer. The control gate electrode is located on the intergate insulating film.

12 Claims, 10 Drawing Sheets

(56) References Cited

U.S. PATENT DOCUMENTS

| | | | |
|---|---|---|---|
| 2002/0173107 A1* | 11/2002 | Doong et al. | 438/301 |
| 2002/0179962 A1* | 12/2002 | Kinoshita | 257/315 |
| 2004/0099900 A1* | 5/2004 | Iguchi et al. | 257/315 |
| 2005/0051834 A1* | 3/2005 | Kitamura et al. | 257/315 |
| 2005/0139900 A1* | 6/2005 | Jung et al. | 257/319 |
| 2005/0167745 A1* | 8/2005 | Ishida et al. | 257/329 |
| 2006/0128099 A1* | 6/2006 | Kim et al. | 438/258 |
| 2006/0163642 A1* | 7/2006 | Widdershoven et al. | 257/315 |
| 2006/0250855 A1* | 11/2006 | Van Duuren | 365/185.33 |
| 2007/0023815 A1* | 2/2007 | Oh et al. | 257/314 |
| 2007/0108498 A1* | 5/2007 | Lee et al. | 257/315 |
| 2007/0111447 A1* | 5/2007 | Cremonesi et al. | 438/261 |
| 2007/0267682 A1* | 11/2007 | Tanaka et al. | 257/315 |
| 2007/0298568 A1* | 12/2007 | Mokhlesi | 438/257 |
| 2008/0003742 A1* | 1/2008 | Cho et al. | 438/257 |
| 2008/0017916 A1* | 1/2008 | Kanetaka | 257/316 |
| 2008/0054341 A1* | 3/2008 | Natori et al. | 257/316 |
| 2008/0105915 A1* | 5/2008 | Park et al. | 257/314 |
| 2008/0121972 A1* | 5/2008 | Shiozawa et al. | 257/316 |
| 2008/0135920 A1* | 6/2008 | Liao et al. | 257/324 |
| 2008/0144383 A1* | 6/2008 | Ishii et al. | 365/185.18 |
| 2008/0219054 A1* | 9/2008 | Arai et al. | 365/185.13 |
| 2008/0258202 A1* | 10/2008 | Shimizu | 257/316 |
| 2009/0011586 A1* | 1/2009 | Akahori et al. | 438/591 |
| 2009/0026525 A1* | 1/2009 | Wang et al. | 257/316 |
| 2009/0039511 A1* | 2/2009 | Jeon | 257/741 |
| 2009/0087976 A1* | 4/2009 | Hendriks et al. | 438/593 |
| 2009/0233416 A1* | 9/2009 | Kim | 438/437 |
| 2009/0253243 A1* | 10/2009 | Cho et al. | 438/437 |
| 2009/0267177 A1* | 10/2009 | Ide et al. | 257/516 |
| 2010/0093143 A1* | 4/2010 | Ide et al. | 438/261 |
| 2010/0197130 A1* | 8/2010 | Ozawa et al. | 438/594 |
| 2010/0221890 A1* | 9/2010 | Kobayashi et al. | 438/424 |
| 2010/0297826 A1* | 11/2010 | Yun | 438/424 |
| 2011/0037115 A1* | 2/2011 | Kim et al. | 257/316 |
| 2011/0198683 A1* | 8/2011 | Lee | 257/324 |

* cited by examiner (FIRST EMBODIMENT)

(FIRST EMBODIMENT)

(FIRST EMBODIMENT)

(FIRST EMBODIMENT)

(FIRST EMBODIMENT)

(SECOND EMBODIMENT)

(THIRD EMBODIMENT)

(FOURTH EMBODIMENT)

NONVOLATILE MEMORY DEVICE

CROSS REFERENCE TO RELATED APPLICATIONS

This application is based upon and claims the benefit of priority from the prior Japanese Patent Application No. 2010-154850, filed on Jul. 7, 2010, the entire contents of which are incorporated herein by reference.

FIELD

Embodiments described herein relates generally to a nonvolatile memory device.

BACKGROUND

For example, a nonvolatile memory device 500 shown in FIG. 10 is known as a conventional nonvolatile memory device. In the nonvolatile memory device 500, a control gate 54 is provided on a floating gate 51 and an element isolation insulating film 52 via an intergate insulating film 53.

However, according to this nonvolatile memory device 500, the distance (see an arrow 57 in FIG. 10) between an active region 56 of a substrate 55 under the floating gate 51 and the control gate electrode 54 above the element isolation insulating film 52 is reduced by miniaturization. Therefore, a high electric field is applied to this active region during a writing or erasing operation. This may lead to a dielectric breakdown or to damage to the active region.

There is known another nonvolatile memory device in which part of an intergate insulating film in a memory cell region is included in an element isolation trench of a substrate. According to this nonvolatile memory device, part of a control gate electrode is also included in the element isolation trench, so that a large region of the side surface of a floating gate electrode faces the control gate electrode. Thus, this nonvolatile memory device has a high coupling ratio.

However, according to this nonvolatile device, the distance between an active region of the substrate under the floating gate and the control gate electrode above an element isolation insulating film is smaller than that in the nonvolatile memory device 500 described above. Therefore, a dielectric breakdown or damage to the active region may be caused by miniaturization.

DETAILED DESCRIPTION

In general, according to one embodiment, a nonvolatile memory device includes a substrate, first and second tunnel insulating films, first and second floating gate electrodes, an intergate insulating film and a control gate electrode. The substrate has first and second active regions isolated from each other by an element isolation trench. The first and second tunnel insulating films are located in the first and second active regions, respectively. The first and second floating gate electrodes are located on the first and second tunnel insulating films, respectively. The intergate insulating film includes a first insulating layer of a first insulating material, an electron trap layer of a second insulating material on the first insulating layer, and a second insulating layer of the first insulating material on the electron trap layer. The control gate electrode is located on the intergate insulating film. The first insulating layer is located on top surfaces and side surfaces of the first and second floating gate electrodes, located on side surfaces of the first and second tunnel insulating films, and located on at least a part of an inner surface of the element isolation trench. The second insulating material includes an electron trapping property lower than the electron trapping property of the first insulating material. The electron trap layer is located at least between the first floating gate electrode and the second floating gate electrode and between the first tunnel insulating film and the second tunnel insulating film.

Embodiments will now be explained with reference to the accompanying drawings.

First Embodiment (Configuration of Nonvolatile Memory Device)

Figure 1:
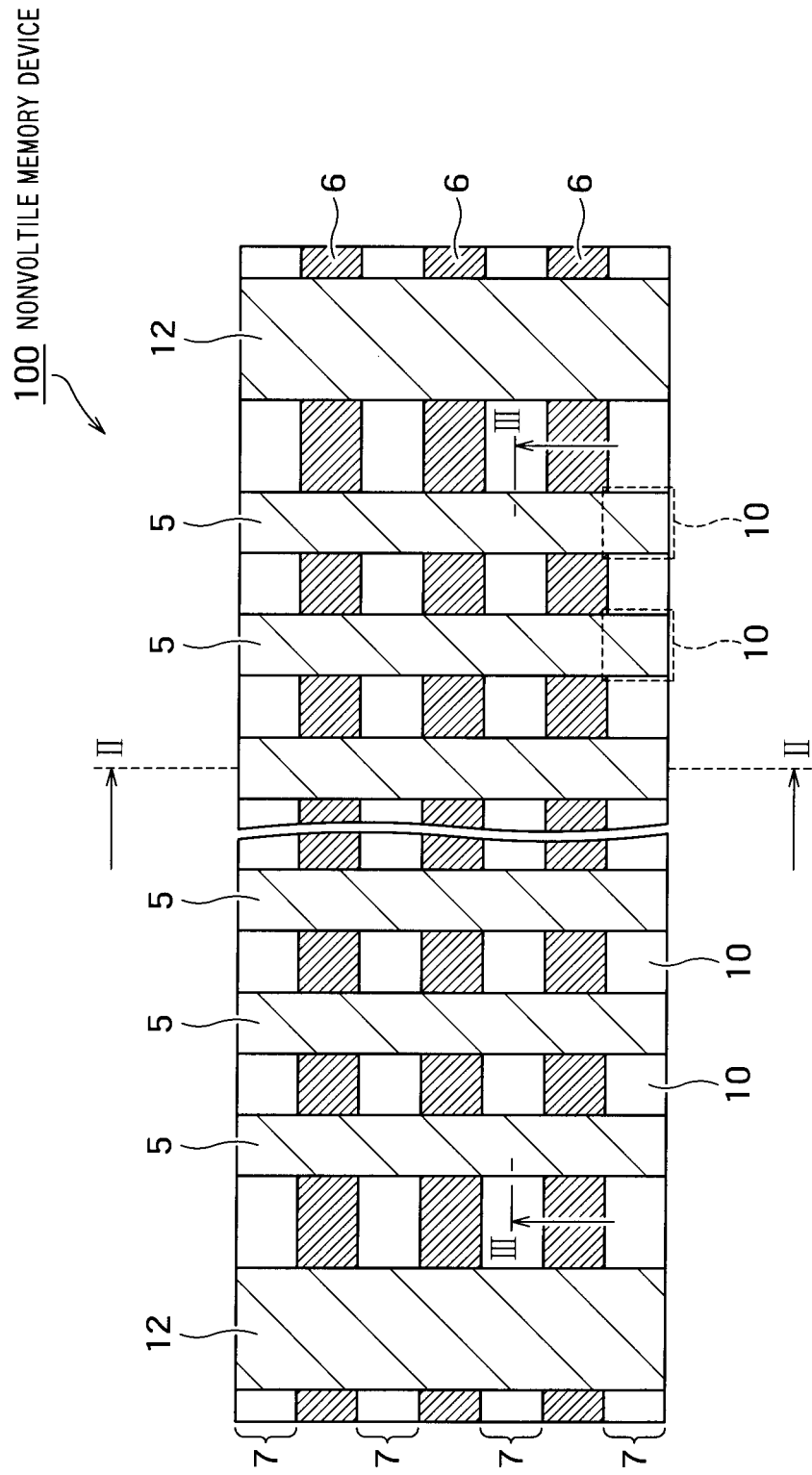
FIG. 1 is a top view of a nonvolatile memory device according to a first embodiment.
Figure 2:
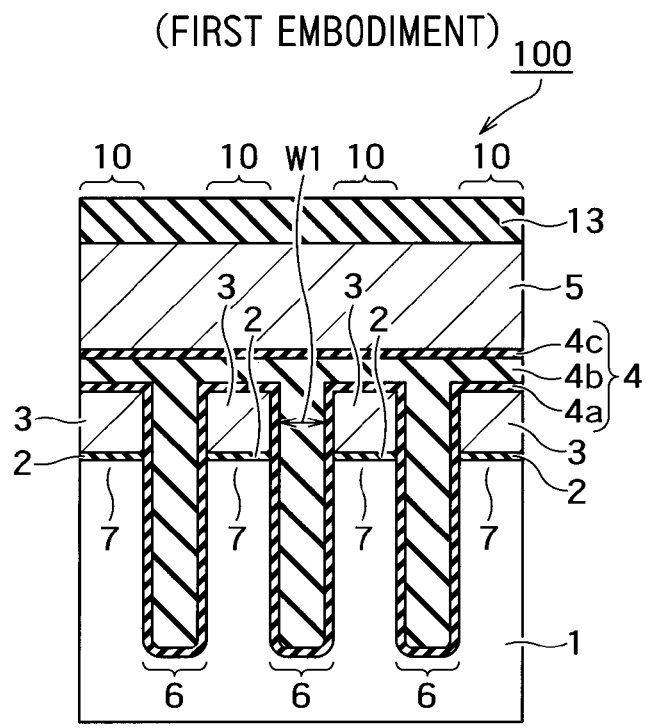
FIG. 2 is a vertical sectional view of the nonvolatile memory device along the segment II-II (control gate direction) of FIG. 1.
Figure 3:
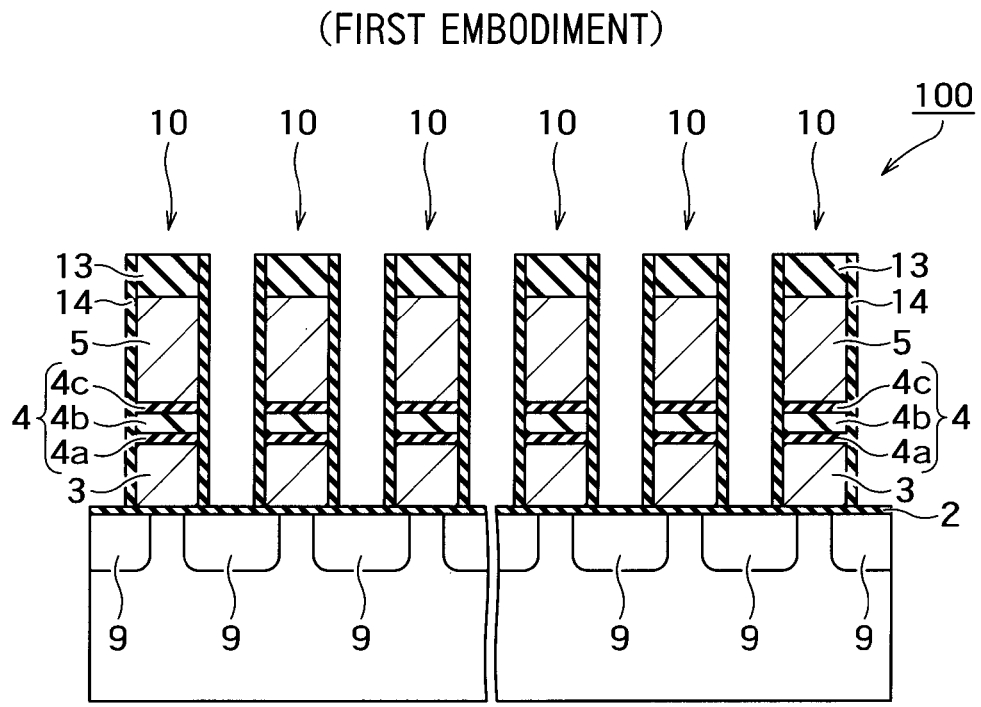
FIG. 3 is a vertical sectional view of the nonvolatile memory device along the segment (active region direction) of FIG. 1.

FIG. 1 is a top view of a nonvolatile memory device 100 according to a first embodiment. FIG. 2 is a vertical sectional view of the nonvolatile memory device 100 along the segment II-II (control gate direction) of FIG. 1. FIG. 3 is a vertical sectional view of the nonvolatile memory device 100 along the segment III-III (active region direction) of FIG. 1.

The nonvolatile memory device 100 is a NAND-type memory element having a plurality of stacked-gate cell transistors 10 that are arrayed.

The memory cell transistor 10 has a tunnel insulating film 2 on a semiconductor substrate 1, a floating gate electrode 3 on the tunnel insulating film 2, an intergate insulating film 4 on the floating gate electrode 3, and a control gate electrode 5 on the intergate insulating film 4. Moreover, a cap film 13 is formed on the control gate electrode 5, and a sidewall 14 is formed on the side surfaces of the cap film 13, the control gate electrode 5, the intergate insulating film 4 and the floating gate electrode 3. In FIG. 1, the cap film 13 and the sidewall 14 are not shown.

An element isolation trench 6 is formed in an active region 7 in which the memory cell transistor 10 on the semiconductor substrate 1 is formed. The active regions 7 are isolated from each other by the element isolation trench 6. The depth of the element isolation trench 6 is, for example, 200 nm.

The memory cell transistors 10 are connected in series on the active regions 7 via source/drain regions 9. Select transistors 12 are connected, via the source/drain regions 9, to both ends of the memory cell transistors 10 connected in series. The memory cell transistors 10 adjacent via the element isolation trench 6 share the control gate electrode 5.

The floating gate electrode 3 functions as a charge storage layer for storing a charge.

The control gate electrode 5 is connected to a word line (not shown), and functions to control the surface potential of the active region 7 in the memory cell transistor 10.

In writing data into the memory cell transistor 10, the potential of the control gate electrode 5 is increased, and a charge is thereby injected into the floating gate electrode 3 from the active region 7. In erasing data, a negative potential is applied to the control gate electrode 5, and a charge stored in the floating gate electrode 3 is thereby brought out into the active region 7.

The intergate insulating film 4 is formed between the floating gate electrode 3 and the control gate electrode 5, and is formed so as to fill the element isolation trench 6 of the semiconductor substrate 1, a region between the adjacent tunnel insulating films 2 above the element isolation trench 6 and a region between the adjacent floating gate electrodes 3 above the element isolation trench 6.

The intergate insulating film 4 has an insulating layer 4a, an electron trap layer 4b and an insulating layer 4c. The insulating layer 4a is formed on the top surface and side surface of the floating gate electrode 3, on the side surface of the tunnel insulating film 2 and on the inner surface of the element isolation trench 6. The electron trap layer 4b is formed on the top surface and side surface of the floating gate electrode 3, on the side surface of the tunnel insulating film 2 and on the inner surface of the element isolation trench 6 via the insulating layer 4a. The insulating layer 4c is formed on the electron trap layer 4b.

The insulating layer 4a and the electron trap layer 4b fill the element isolation trench 6, the space between the adjacent tunnel insulating films 2 above the element isolation trench 6 and the space between the adjacent floating gate electrodes 3 above the element isolation trench 6. Thus, the insulating layer 4c is formed at a position higher than the top surface of the floating gate electrode 3.

As the intergate insulating film 4 functions as an element isolation insulating film in the element isolation trench 6, there is no need to independently form an element isolation insulating film in the element isolation trench in contrast with conventional nonvolatile memory devices. In the present embodiment, the conventional element isolation insulating film is not formed, and the number of steps can therefore be reduced.

The electron trap layer 4b is made of an insulating material having an electron trapping property. The insulating layers 4a and 4c are made of an insulating material lower in electron trapping property than the material of the electron trap layer 4b. For example, silicon nitride, metal oxide or metal silicate can be used as the insulating material having the electron trapping property. When, for example, silicon nitride is used as the material of the electron trap layer 4b, silicon oxide, for example, can be used for the insulating layers 4a and 4c as an insulating material lower in electron trapping property than silicon nitride.

The intergate insulating film 4 is an ONO film (a laminated film of a silicon oxide film, a silicon nitride film and a silicon oxide film) in which the insulating layers 4a and 4c are silicon oxide films and the electron trap layer 4b is a silicon nitride film.

The electron trap layer 4b has the electron trapping property, and is therefore capable of trapping electrons which move to the control gate electrode 5 from the active region 7 of the semiconductor substrate 1 during writing of data into the memory cell transistor 10 and during erasing of data. The electrons trapped in the electron trap layer 4b can ease an electric field between the active region 7 and the control gate electrode 5.

The insulating layers 4a and 4c function to inhibit the electrons trapped in the electron trap layer 4b from moving to the active region 7 or the control gate electrode 5.

In the present embodiment, the electron trap layer 4b (and the insulating layer 4a) is located in the element isolation trench 6 of the semiconductor substrate 1, in the region between the adjacent tunnel insulating films 2 above the element isolation trench 6 and in the region between the adjacent floating gate electrodes 3 above the element isolation trench 6, and is therefore located between the control gate electrode 5 on the element isolation trench 6 and the active region 7. Thus, the electron trap layer 4b can effectively trap the electrons which move to the control gate electrode 5 from the active region 7 during writing of data into the memory cell transistor 10 and during erasing of data. As a result, a dielectric breakdown and/or damage to the active region are prevented.

In order to efficiently trap electrons, a width W1 (see FIG. 2) of the electron trap layer 4b in the length direction of the control gate electrode 5 is preferably 3 nm or more in the region between the adjacent tunnel insulating films 2 in the element isolation trench 6 and in the region between the adjacent floating gate electrodes 3 in the element isolation trench 6.

Furthermore, the insulating layer 4a is only present between the active region 7 and the electron trap layer 4b, and the distance between the active region 7 and the electron trap layer 4b is small. Therefore, electrons can be efficiently trapped.

An example of a method of manufacturing the nonvolatile memory device 100 according to the present embodiment is shown below.

(Manufacture of Nonvolatile Memory Device)

FIGS. 4A to 4H are vertical sectional views showing a process of manufacturing the nonvolatile memory device 100 according to the first embodiment.

Figure 4A:
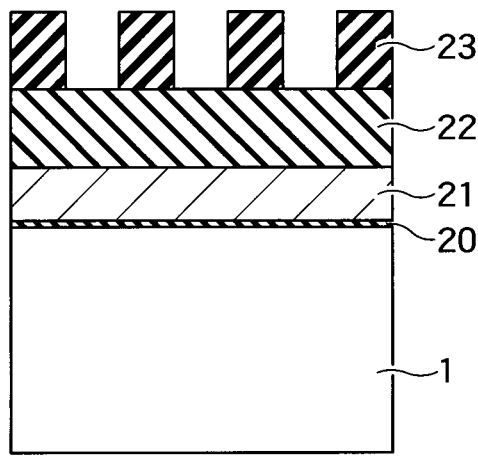
FIGS. 4A to 4H are vertical sectional views along the control gate direction showing a process of manufacturing the nonvolatile memory device according to the first embodiment.

First, as shown in FIG. 4A, films 20 and 21 and a hard mask 22 are formed on a semiconductor substrate 1, on which a photoresist 23 is formed. The semiconductor substrate 1 is made of an Si-based crystal such as an Si crystal.

The films 20 and 21 are films to be processed into a tunnel insulating film 2 and a floating gate electrode 3 in the subsequent step. The film 20 is made of an insulating material such as $SiO_2$, and has a thickness of, for example, 8 nm. The film 21 is made of a conducting material such as polycrystalline silicon containing a conducting impurity. The hard mask 22 is, for example, a silicon nitride film or a silicon oxide film formed by chemical vapor deposition (CVD). The photoresist 23 has a pattern of an element isolation trench 6 as an aperture pattern.

Furthermore, as shown in FIG. B, the photoresist 23 is used as a mask to etch the hard mask 22, and the pattern of the photoresist 23 is transferred to the hard mask 22. The photoresist 23 is then removed by exposing the semiconductor substrate 1 to oxygen plasma.

Figure 4B:
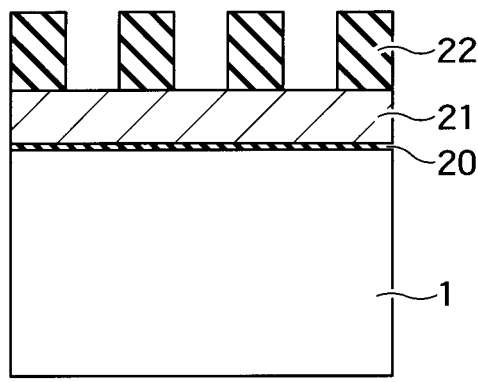
Figure 4C:
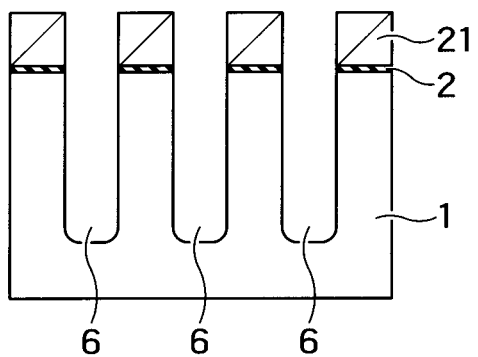

Furthermore, as shown in FIG. 4C, the hard mask 22 is used as a mask to subject the films 21 and 20 and the semiconductor substrate 1 to reactive ion etching (RIE), and the pattern of the hard mask 22 is transferred to the films 21 and 20 and the semiconductor substrate 1. As a result, the element isolation trench 6 is formed in the semiconductor substrate 1, and the film 20 is processed into the tunnel insulating film 2. The thickness of the hard mask 22 and its RIE conditions are adjusted in a manner that the hard mask 22 may disappear simultaneously with the completion of the formation of the element isolation trench 6. After the formation of the element isolation trench 6, a post-treatment using, for example, an SH solution (solution including $H_2SO_4$ and $H_2O_2$) is conducted.

Figure 4D:
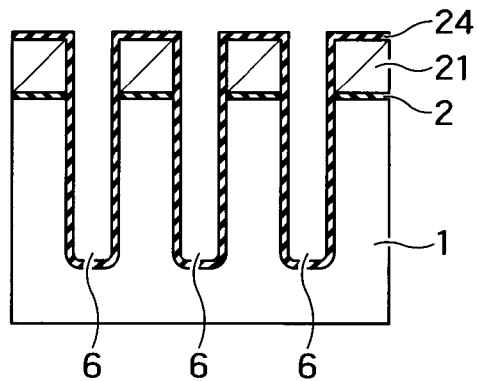

Furthermore, as shown in FIG. 4D, an insulating film 24 is formed by, for example, the CVD, physical vapor deposition (PVD) or atomic layer deposition (ALD) so as to cover the top surface and side surface of the film 21 and the inner surface of the element isolation trench 6. The insulating film 24 is a film to be processed into an insulating layer 4a in the subsequent step.

Figure 4E:
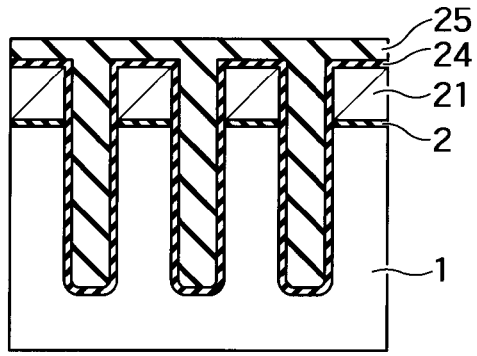

Furthermore, as shown in FIG. 4E, an insulating film 25 is formed by, for example, the CVD, PVD or ALD so as to cover the surface of the insulating film 24. The insulating film 25 is a film to be processed into an electron trap layer 4b in the subsequent step.

The element isolation trench 6 of the semiconductor substrate 1, a region between the adjacent tunnel insulating films 2 above the element isolation trench 6 and a region between the adjacent floating gate electrodes 3 above the element isolation trench 6 are filled with the insulating films 24 and 25.

Figure 4F:
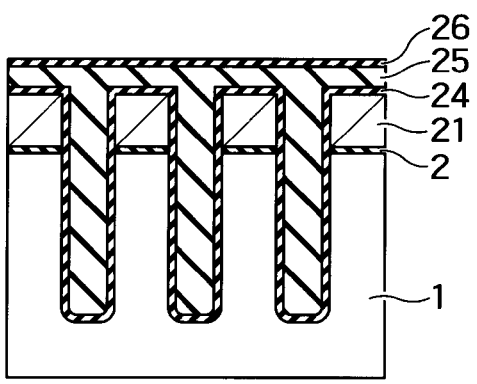

Furthermore, as shown in FIG. 4F, an insulating film 26 is formed by, for example, the CVD, PVD or ALD so as to cover the surface of the insulating film 25. The insulating film 26 is a film to be processed into an insulating layer 4c in the subsequent step.

Figure 4G:
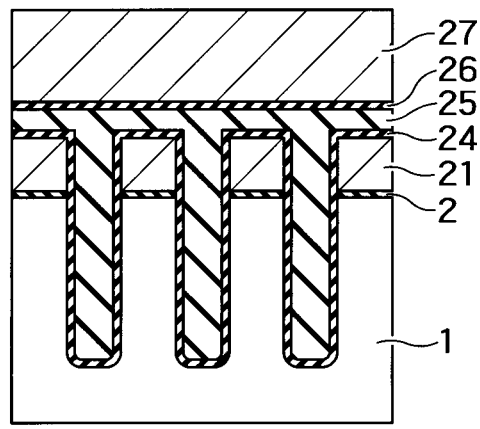

Furthermore, as shown in FIG. 4G, a film 27 is formed on the insulating film 26. The film 27 is a film to be processed into a control gate electrode 5 in the subsequent step. The film 27 is made of a conducting material such as polycrystalline silicon containing a conducting impurity.

Figure 4H:
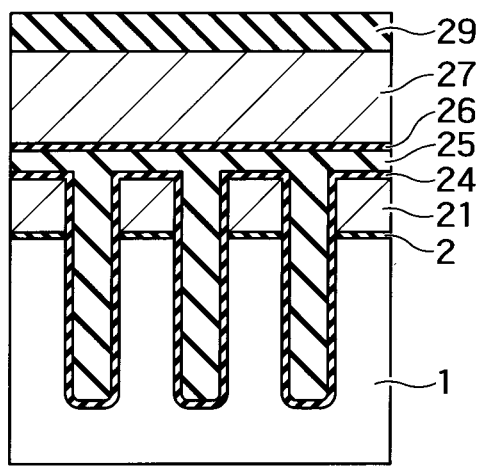

Furthermore, as shown in FIG. 4H, a film 29 is formed on the film 27. The film 29 is an insulating film to be processed into a cap film 13 in the subsequent step.

Subsequently, the pattern of the control gate electrode 5 is formed in the films 29 and 27, the insulating films 26, 25 and 24 and the film 21 by a lithographic process. As a result, the cap film 13, the control gate electrode 5, the insulating layer 4c, the electron trap layer 4b, the insulating layer 4a and the floating gate electrode 3 are obtained.

Furthermore, a sidewall 14 (see FIG. 3) is formed on the side surfaces of the cap film 13, the control gate electrode 5, the insulating layer 4c, the electron trap layer 4b, the insulating layer 4a and the floating gate electrode 3. After the sidewall 14 is formed, an impurity is injected into an exposed region of the semiconductor substrate 1, and a source/drain region 9 is formed (see FIG. 3).

Second Embodiment

A second embodiment is different from the first embodiment in that an insulating layer 4c of an intergate insulating film 4 is embedded in an element isolation trench 6. It is to be noted that patterns of a control gate electrode 5, the element isolation trench 6, an active region 7 and others are similar to those in the first embodiment (see FIG. 1).

(Configuration of Nonvolatile Memory Device)

Figure 5:
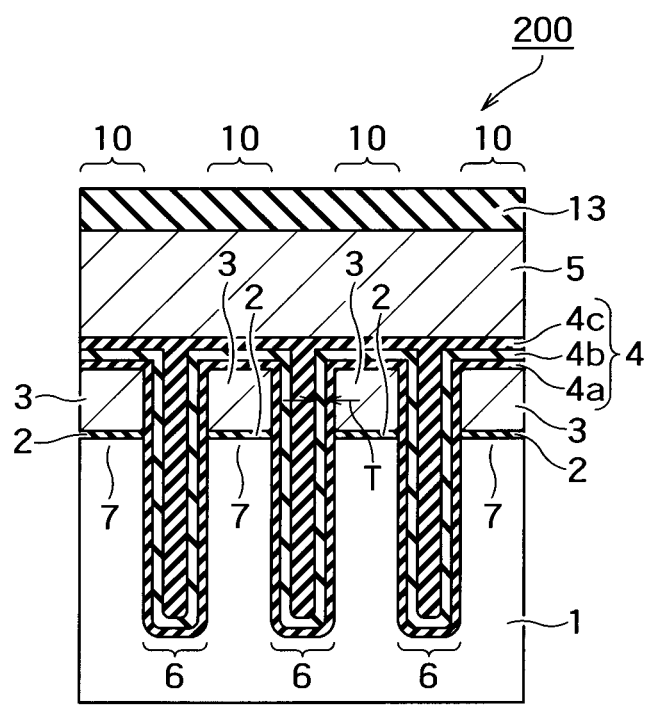
FIG. 5 is a vertical sectional view of a nonvolatile memory device according to a second embodiment along a control gate direction.

FIG. 5 is a vertical sectional view of a nonvolatile memory device 200 according to the second embodiment.

Similarly to the intergate insulating film 4 of the nonvolatile memory device 100 according to the first embodiment, the intergate insulating film 4 of the nonvolatile memory device 200 is formed so as to fill the element isolation trench 6 of a semiconductor substrate 1, a region between adjacent tunnel insulating films 2 above the element isolation trench 6 and a region between adjacent floating gate electrodes 3 above the element isolation trench 6.

The intergate insulating film 4 of the nonvolatile memory device 200 has an insulating layer 4a, an electron trap layer 4b and an insulating layer 4c. The insulating layer 4a is formed on the top surface and side surface of the floating gate electrode 3, on the side surface of the tunnel insulating film 2 and on the inner surface of the element isolation trench 6. The electron trap layer 4b is formed on the top surface and side surface of the floating gate electrode 3, on the side surface of the tunnel insulating film 2 and on the inner surface of the element isolation trench 6 via the insulating layer 4a. The insulating layer 4c is formed on the top surface and side surface of the floating gate electrode 3, on the side surface of the tunnel insulating film 2 and on the inner surface of the element isolation trench 6 via the insulating layer 4a and the electron trap layer 4b.

The insulating layer 4a, the electron trap layer 4b and the insulating layer 4c fill the element isolation trench 6, the space between the adjacent tunnel insulating films 2 above the element isolation trench 6 and the space between the adjacent floating gate electrodes 3 above the element isolation trench 6.

In the present embodiment, the electron trap layer 4b (and the insulating layers 4a and 4c) is located in the element isolation trench 6 of the semiconductor substrate 1, in the region between the adjacent tunnel insulating films 2 above the element isolation trench 6 and in the region between the adjacent floating gate electrodes 3 above the element isolation trench 6. Thus, electrons which move to the control gate electrode 5 from the active region 7 during writing of data into the memory cell transistor 10 and during erasing of data can be effectively trapped. As a result, a dielectric breakdown or damage to the active region is prevented.

In order to efficiently trap electrons, a thickness T (see FIG. 5) of the electron trap layer 4b is preferably 3 nm or more in the region between the adjacent tunnel insulating films 2 in the element isolation trench 6 and in the region between the adjacent floating gate electrodes 3 in the element isolation trench 6.

An example of a method of manufacturing the nonvolatile memory device 200 according to the present embodiment is shown below.

(Manufacture of Nonvolatile Memory Device)

Figure 6A:
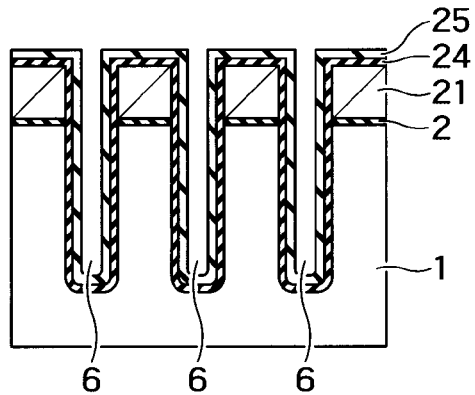
FIGS. 6A to 6C are vertical sectional views along the control gate direction showing a process of manufacturing the nonvolatile memory device according to the second embodiment.

FIGS. 6A to 6 are vertical sectional views showing a process of manufacturing the nonvolatile memory device 200 according to the second embodiment.

First, a process up to the formation of an insulating film 24 shown in FIGS. 4A to 4D is performed as in the first embodiment.

Furthermore, as shown in FIG. 6A, a film 25 is formed by, for example, the CVD, PVD or ALD so as to cover the surface of the insulating film 24. At this stage, the element isolation trench 6 is not filled.

Figure 6B:
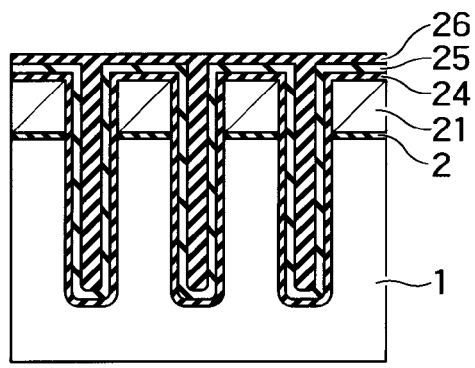

Furthermore, as shown in FIG. 6B, an insulating film 26 is formed by, for example, the CVD, PVD or ALD so as to cover the surface of the insulating film 25.

The element isolation trench 6 of the semiconductor substrate 1, a region between the adjacent tunnel insulating films 2 above the element isolation trench 6 and a region between the adjacent floating gate electrodes 3 above the element isolation trench 6 are filled with the insulating films 24, 25 and 26.

Figure 6C:
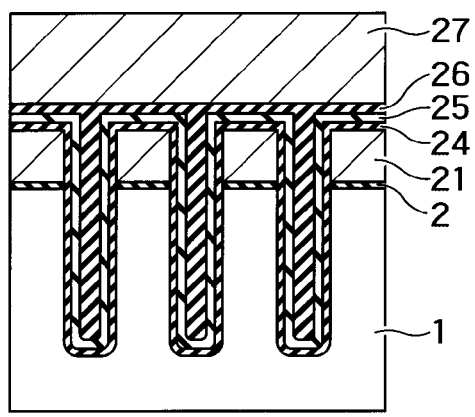

Furthermore, as shown in FIG. 6C, a film 27 is formed on the insulating film 26.

Subsequently, a process after the step of forming a film 29 is performed as in the first embodiment, and the nonvolatile memory device 200 is obtained.

Third Embodiment

A third embodiment is different from the first embodiment in that an element isolation insulating film is formed in an element isolation trench 6. It is to be noted that patterns of a control gate electrode 5, the element isolation trench 6, an active region 7 and others are similar to those in the first embodiment (see FIG. 1).

(Configuration of Nonvolatile Memory Device)

Figure 7:
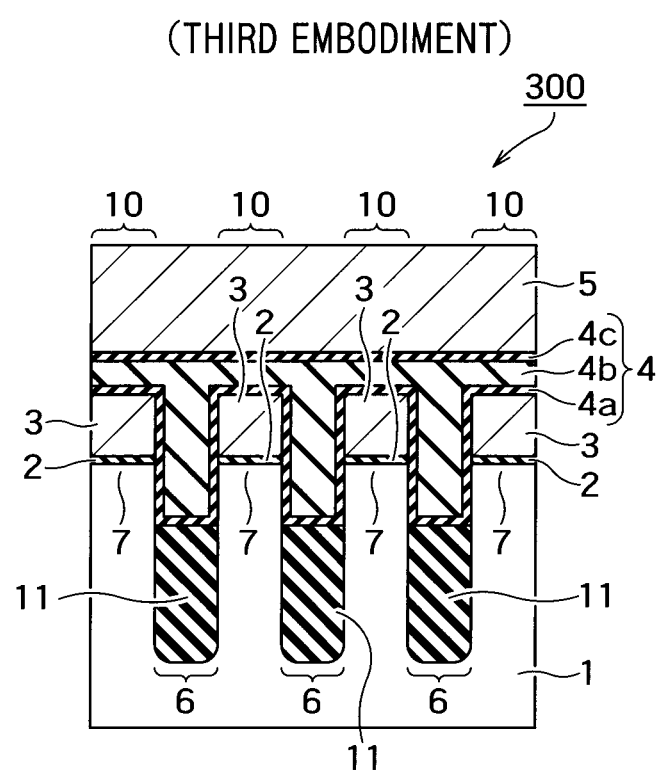
FIG. 7 is a vertical sectional view of a nonvolatile memory device according to a third embodiment along a control gate direction.

FIG. 7 is a vertical sectional view of a nonvolatile memory device 300 according to the third embodiment.

In the nonvolatile memory device 300, an element isolation insulating film 11 is formed in an element isolation trench 6 of a semiconductor substrate 1. The top surface of the element isolation insulating film 11 is positioned lower than the bottom surface of a tunnel insulating film 2. The element isolation insulating film 11 is made of an insulating material such as silicon oxide.

An intergate insulating film 4 is formed so as to fill the space above the element isolation insulating film 11 in the element isolation trench 6, a region between adjacent tunnel insulating films 2 above the element isolation trench 6 and a region between adjacent floating gate electrodes 3 above the element isolation trench 6.

The intergate insulating film 4 has an insulating layer 4a, an electron trap layer 4b and an insulating layer 4c. The insulating layer 4a is formed on the top surface and side surface of the floating gate electrode 3, on the side surface of the tunnel insulating film 2, on part of the inner surface of the element isolation trench 6 that is not in contact with the element isolation insulating film 11 and on the top surface of the element isolation insulating film 11. The electron trap layer 4b is formed on the top surface and side surface of the floating gate electrode 3, on the side surface of the tunnel insulating film 2, on part of the inner surface of the element isolation trench 6 that is not in contact with the element isolation insulating film 11 and on the top surface of the element isolation insulating film 11 via the insulating layer 4a. The insulating layer 4c is formed on the electron trap layer 4b.

The insulating layer 4a and the electron trap layer 4b fill the space in the element isolation trench 6 and above the element isolation insulating film 11, the space between the adjacent tunnel insulating films 2 above the element isolation trench 6 and the space between the adjacent floating gate electrodes 3 above the element isolation trench 6. Thus, the insulating layer 4c is formed at a position higher than the top surface of the floating gate electrode 3.

In the present embodiment, the electron trap layer 4b (and the insulating layer 4a) is located in the element isolation trench 6 of the semiconductor substrate 1, in the region between the adjacent tunnel insulating films 2 above the element isolation trench 6 and in the region between the adjacent floating gate electrodes 3 above the element isolation trench 6. Thus, the electrons which move to the control gate electrode 5 from the active region 7 during writing of data into the memory cell transistor 10 and during erasing of data can be effectively trapped. As a result, a dielectric breakdown or damage to the active region is prevented.

An example of a method of manufacturing the nonvolatile memory device 300 according to the present embodiment is shown below.

(Manufacture of Nonvolatile Memory Device)

Figure 8A:
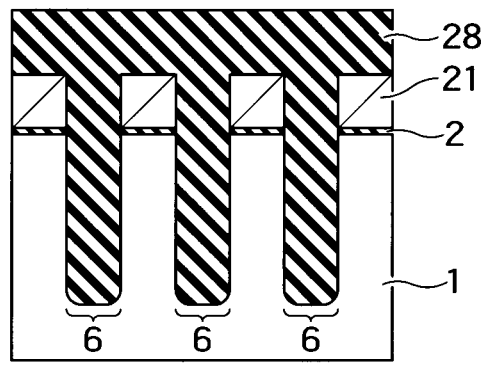
FIGS. 8A to 8C are vertical sectional views along the control gate direction showing a process of manufacturing the nonvolatile memory device according to the third embodiment.
Figure 8B:
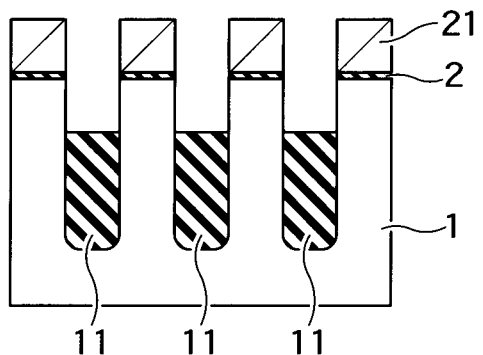
Figure 8C:
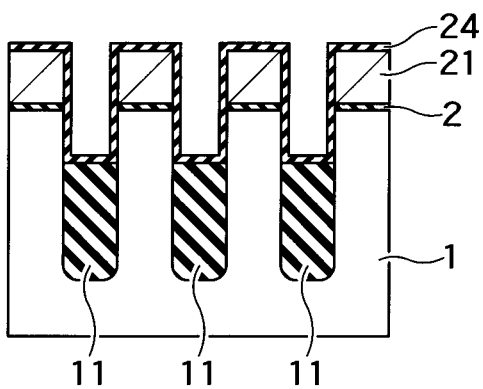

FIGS. 8A to 8C are vertical sectional views showing a process of manufacturing the nonvolatile memory device 300 according to the third embodiment.

First, a process up to the formation of an element isolation trench 6 shown in FIGS. 4A to 4C is performed as in the first embodiment.

Furthermore, as shown in FIG. 8A, an insulating material such as silicon oxide is deposited on the semiconductor substrate 1 by the CVD, and an insulating film 28 is formed so as to fill the element isolation trench 6.

Furthermore, as shown in FIG. 8B, the insulating film 28 is etched back by the RIE so that the top surface of this insulating film 28 may be lower than the bottom surface of the film 20. As a result, an element isolation insulating film 11 in the element isolation trench 6 is formed.

Furthermore, as shown in FIG. 8C, an insulating film 24 is formed by, for example, the CVD, PVD or ALD so as to cover the top surface and side surface of the film 21, the exposed inner surface of the element isolation trench 6 and the top surface of the element isolation insulating film 11.

Subsequently, a process after the step of forming a film 25 is performed as in the first embodiment, and the nonvolatile memory device 300 is obtained.

Fourth Embodiment

A fourth embodiment is different from the first embodiment in the number of insulating films included in an intergate insulating film. It is to be noted that patterns of a control gate electrode 5, an element isolation trench 6, an active region 7 and others are similar to those in the first embodiment (see FIG. 1).

(Configuration of Nonvolatile Memory Device)

Figure 9:
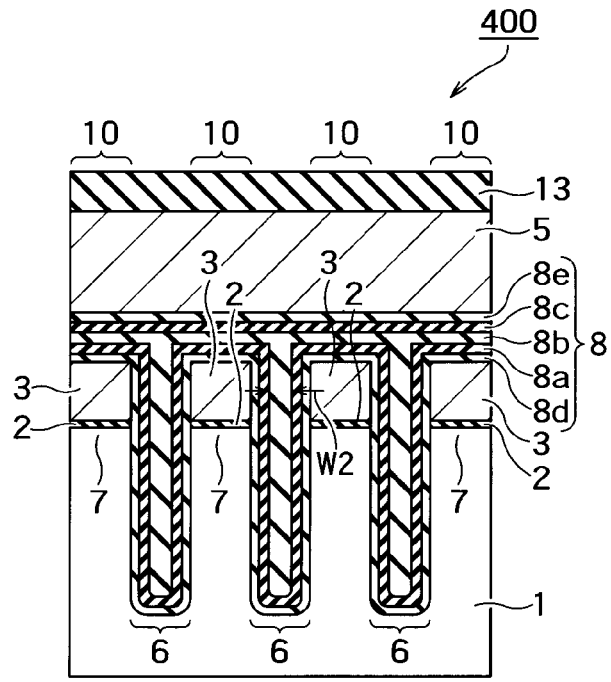
FIG. 9 is a vertical sectional view of a nonvolatile memory device according to a fourth embodiment along a control gate direction.
Figure 10:
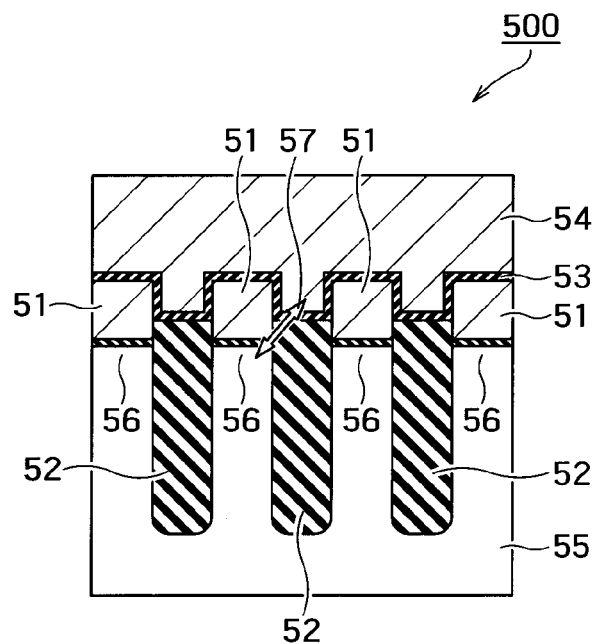
FIG. 10 is a vertical sectional view of a nonvolatile memory device according to a conventional example along a control gate direction.

FIG. 9 is a vertical sectional view of a nonvolatile memory device 400 according to the fourth embodiment.

As the intergate insulating film, the nonvolatile memory device 400 has an intergate insulating film 8. The intergate insulating film 8 has an electron trap layer 8b corresponding to the electron trap layer 4b in the first embodiment, an insulating layer 8a corresponding to the insulating layer 4a, and an insulating layer 8c corresponding to the insulating layer 4c. The intergate insulating film 8 further has an insulating layer 8d under the insulating layer 8a, and an insulating layer 8e under the insulating layer 8c.

The insulating layer 8d is formed on the top surface and side surface of a floating gate electrode 3, on the side surface of a tunnel insulating film 2 and on the inner surface of the element isolation trench 6. The insulating layer 8a is formed on the top surface and side surface of the floating gate electrode 3, on the side surface of the tunnel insulating film 2 and on the inner surface of the element isolation trench 6 via the insulating layer 8d. The electron trap layer 8b is formed on the top surface and side surface of the floating gate electrode 3, on the side surface of the tunnel insulating film 2 and on the inner surface of the element isolation trench 6 via the insulating layers 8d and 8a. The insulating layer 8c is formed on the electron trap layer 8b. The insulating layer 8e is formed on the insulating layer 8c.

The insulating layers 8d and 8a and the electron trap layer 8b fill the element isolation trench 6, the space between the adjacent tunnel insulating films 2 above the element isolation trench 6 and the space between the adjacent floating gate electrodes 3 above the element isolation trench 6. Thus, the insulating layers 8c and 8e are formed at positions higher than the top surface of the floating gate electrode 3.

The intergate insulating film 8 is, for example, a NONON film (a laminated film of a silicon nitride film, a silicon oxide film, a silicon nitride film, a silicon oxide film and a silicon nitride film) in which the insulating layers 8a and 8c are silicon oxide films and the electron trap layer 8b and the insulating layers 8d and 8e are silicon nitride films.

In the present embodiment, the electron trap layer 8b (and the insulating layers 8a and 8d) is located in the element isolation trench 6 of the semiconductor substrate 1, in the region between the adjacent tunnel insulating films 2 above the element isolation trench 6 and in the region between the adjacent floating gate electrodes 3 above the element isolation trench 6. Thus, electrons which move to the control gate electrode 5 from the active region 7 during writing of data into the memory cell transistor 10 and during erasing of data can be effectively trapped. As a result, a dielectric breakdown or damage to the active region is prevented.

In order to efficiently trap electrons, a width W2 (see FIG. 9) of the electron trap layer 8b in the length direction of the control gate electrode 5 is preferably 3 nm or more in the region between the adjacent tunnel insulating films 2 in the element isolation trench 6 and in the region between the adjacent floating gate electrodes 3 in the element isolation trench 6.

The intergate insulating film 8 has only to be structured to have at least the electron trap layer 8b and the insulating layers 8a and 8c. For example, the intergate insulating film 8 may be structured to only have one of the insulating layer 8d and the insulating layer 8e, and may be structured to additionally have a high dielectric insulating film of, for example, alumina.

Moreover, the intergate insulating film 8 may have a structure in which the electron trap layer 8b, the insulating layer 8c and the insulating layer 8e are only formed without the insulating layer 8d and the insulating layer 8a. Alternatively, the intergate insulating film 8 may have a structure in which the electron trap layer 8b, the insulating layer 8a and the insulating layer 8d are only formed without the insulating layer 8e and the insulating layer 8c.

Furthermore, the intergate insulating film 8 may be combined with the nonvolatile memory device 100 according to the first embodiment, the nonvolatile memory device 200 according to the second embodiment or the nonvolatile memory device 300 according to the third embodiment.

Advantages of Embodiments

According to the first to fourth embodiments, the electron trap layer in the intergate insulating film is located in at least the region between the adjacent floating gate electrodes above the element isolation trench and the region between the adjacent tunnel insulating films above the element isolation trench. Thus, the electron trap layer is located between the active region 7 and the control gate electrode 5 on the element isolation trench 6, so that electrons which move to the control gate electrode from the active region of the semiconductor substrate during writing of data into the memory cell transistor and during erasing of data can be trapped. The electrons trapped in the electron trap layer can ease an electric field between the active region and the control gate electrode, and a dielectric breakdown and damage to the active region of the substrate can be inhibited.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. For example, although the NAND-type memory element is used as the nonvolatile memory device in the first to fourth embodiments, other types of nonvolatile memory devices having stacked-gate cell transistors may be used. Moreover, the order in the process of manufacturing the nonvolatile memory device shown in the first to third embodiments is not limited to the order described above. The accompanying claims and their equivalents are intended to cover such forms or modifications as would fall within the scope and spirit of the inventions.

The invention claimed is:

1. A nonvolatile memory device comprising:
a substrate comprising first and second active regions isolated from each other by an element isolation trench;
first and second tunnel insulating films located in the first and second active regions, respectively;
first and second floating gate electrodes located on the first and second tunnel insulating films, respectively;
a control gate electrode located above the first and second floating gate electrodes;
a first insulating layer of a first insulating material located on top surfaces and side surfaces of the first and second floating gate electrodes, located in direct physical contact with side surfaces of the first and second tunnel insulating films and located on an inner surface of the element isolation trench;
an electron trap layer of a second insulating material located on the first insulating layer, the second insulating material comprising an electron trapping property by which an electron moving from the first and second active regions to the control gate electrode is trapped; and
a second insulating layer of the first insulating material on the electron trap layer,
wherein the first insulating material is lower in electron trapping property than the second material, and
the first insulating layer and the electron trap layer fill the element isolation trench, fill a first space between the first tunnel insulating film and the second tunnel insulating film, and fill a second space between the first floating gate electrode and the second floating gate electrode; and
wherein the second insulating layer is in direct physical contact with the electron trap layer and does not fill the second space between the first floating gate electrode and the second floating gate electrode.

2. The device of claim 1,
wherein the second insulating material is silicon nitride, a metal oxide film or metal silicate, and
the electron trap layer comprises a single-layer structure or a laminated structure.

3. The device of claim 1,
wherein the first insulating material is silicon oxide, and
the second insulating material is silicon nitride.

4. The device of claim 1, further comprising:
a third insulating layer of the second insulating material located between the inner surface of the element isolation trench and the first insulating layer, located between the top surface of the first floating gate electrode and the first insulating layer, located between the side surface of the first floating gate electrode and the first insulating layer, located between the top surface of the second floating gate electrode and the first insulating layer, and located between the side surface of the second floating gate electrode and the first insulating layer.

5. The device of claim 4,
wherein the second insulating material is silicon nitride.

6. The device of claim 4, further comprising:
a fourth insulating layer of the second insulating material on the second insulating layer.

7. The device of claim 6,
wherein the second insulating material is silicon nitride.

8. The device of claim 1, further comprising:
a fourth insulating layer of the second insulating material on the second insulating layer.

9. The device of claim 8,
wherein the second insulating material is silicon nitride.

10. A nonvolatile memory device comprising:
a substrate comprising first and second active regions isolated from each other by an element isolation trench;
first and second tunnel insulating films located in the first and second active regions, respectively;
first and second floating gate electrodes located on the first and second tunnel insulating films, respectively;
a control gate electrode located above the first and second floating gate electrodes;
a first insulating layer of a first insulating material located on top surfaces and side surfaces of the first and second floating gate electrodes, located in direct physical contact with side surfaces of the first and second tunnel insulating films and located on an inner surface of the element isolation trench;
an electron trap layer of a second insulating material located on the first insulating layer, the second insulating material comprising an electron trapping property by which an electron moving from the first and second active regions to the control gate electrode is trapped; and
a second insulating layer formed of the first insulating material located on the electron trap layer,
wherein the first insulating material is lower in electron trapping property than the second material, and
the first insulating layer, the electron trap layer and the second insulating layer fill the element isolation trench, fill a first space between the first tunnel insulating film and the second tunnel insulating film, and fill a second space between the first floating gate electrode and the second floating gate electrode; and
wherein the second insulating layer is in direct physical contact with the electron trap layer and does not fill the second space between the first floating gate electrode and the second floating gate electrode.

11. The device of claim 10,
wherein the second insulating material is silicon nitride, a metal oxide film or metal silicate, and
the electron trap layer comprises a single-layer structure or a laminated structure.

12. The device of claim 10,
wherein the first insulating material is silicon oxide, and
the second insulating material is silicon nitride.

* * * * *